(12) United States Patent
Mizuno et al.

(10) Patent No.: US 6,709,909 B2
(45) Date of Patent: Mar. 23, 2004

(54) SEMICONDUCTOR DEVICE AND METHOD OF MANUFACTURING THE SAME

(75) Inventors: Tomohisa Mizuno, Kanagawa-ken (JP); Naoharu Sugiyama, Kanagawa-ken (JP); Shinichi Takagi, Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 10/440,133

(22) Filed: May 19, 2003

(65) Prior Publication Data
US 2003/0193060 A1 Oct. 16, 2003

Related U.S. Application Data

(62) Division of application No. 09/810,607, filed on Mar. 19, 2001, now Pat. No. 6,583,437.

(30) Foreign Application Priority Data
Mar. 17, 2000 (JP) .................................. 2000-075171

(51) Int. Cl.[7] ............................................. H01L 21/338
(52) U.S. Cl. ...................... 438/167; 438/752; 438/933; 438/938
(58) Field of Search ................................ 438/167, 603, 438/682, 752, 933, 938

(56) References Cited

U.S. PATENT DOCUMENTS

| | | | |
|---|---|---|---|
| 5,847,419 A | * 12/1998 | Imai et al. ................... | 257/192 |
| 5,891,769 A | 4/1999 | Liaw et al. | |
| 5,906,951 A | 5/1999 | Chu et al. | |
| 6,326,667 B1 | 12/2001 | Sugiyama et al. | |
| 6,350,993 B1 | 2/2002 | Chu et al. | |

FOREIGN PATENT DOCUMENTS

JP       5-82558       4/1993

OTHER PUBLICATIONS

T. Mizuno et al., "High Performance Strained–Si p–MOS-FETs on SiGe–on–Insulator Substrates Fabricated by SIMOX Technology", pp. 22.8.1–22.8.3.
T. Mizuno et al., "Advanced SOI–MOSFETs with Strained–Si Channel for High Speed CMOS–Electron/Hole Mobility Enhancement", pp. 210–211.

* cited by examiner

Primary Examiner—Amir Zarabian
Assistant Examiner—Pamela E. Perkins
(74) Attorney, Agent, or Firm—Oblon, Spivak, McClelland, Maier & Neustadt, P.C.

(57) ABSTRACT

A method of manufacturing a semiconductor device which includes forming a first SiGe layer having a low content of Ge, forming an oxide layer by implanting oxygen ions into the first SiGe layer, and then annealing the first SiGe layer. The method also includes forming, on the first SiGe layer, a second SiGe layer which has a higher content of Ge than the first SiGe layer, forming a strained Si layer on the second SiGe layer, and forming a field effect transistor in which the strained Si layer is used a channel region. Further, a field effect transistor may be formed on a semiconductor substrate having an indefectible, high-quality, buried oxide layer and a largely strained Si layer, and hence a high-speed, low-power-consumption semiconductor device can be realized.

9 Claims, 3 Drawing Sheets

SEMICONDUCTOR DEVICE AND METHOD OF MANUFACTURING THE SAME

This application is a division of Ser. No. 09/810,607 filed on Mar. 19, 2001 now U.S. Pat. No. 6,583,437.

CROSS-REFERENCE TO RELATED APPLICATIONS

This application is based upon and claims the benefit of priority from the prior Japanese Patent Application No. 2000-075171, filed on Mar. 17, 2000, the entire contents of which are incorporated herein by reference.

BACKGROUND OF THE INVENTION

1. Field of the Invention

The present invention relates to a semiconductor device and method of manufacturing a semiconductor device.

2. Discussion of the Background

A silicon MOS field effect transistor included in semiconductor elements has achieved a high density integration and has increased a driving force at the same time by microminiaturizing the size of an element, in particular, the length of a gate. However, the microminiaturization of the element is limited by physical and economic barriers. Therefore, a technology is required to increase the speed of the semiconductor device and to reduce its power consumption by a method other than microminiaturization.

For this reason, in recent years, a field effect transistor using a semiconductor substrate including an underlying layer having a relaxed SiGe formed on a Si substrate and a strained Si layer thinly formed thereon has been proposed. In this field effect transistor, carriers have high mobility characteristics in the strained Si layer and thus the use of the strained Si layer as a channel region makes it possible to increase the speed of the semiconductor element and to reduce its power consumption.

However, an increase in the concentration of channel impurities in the channel of the field effect transistor for the purpose of preventing a short channel effect thereof results in an increase in the parasitic capacitance of a source/drain diffusion layer. It is known the use of a semiconductor substrate having a SOI structure including a silicon wafer, a silicon oxide layer formed on the silicon wafer, and a semiconductor layer formed on the silicon oxide layer is effective for reducing this parasitic capacitance.

A MOS field effect transistor using a semiconductor substrate having the SOI structure and the strained Si layer is disclosed in Japanese Patent Publication (Laid-Open) No. 1997-321307. Further, a background method of manufacturing a semiconductor device and its structure is disclosed in the Japanese Patent Publication (Laid-Open) No. 1997-321307 and will be described with reference to FIG. 1.

As shown in FIG., 1, a graded SiGe layer 2 is formed on a Si wafer 1 such that the content of Ge gradually increases. Next, a thick stress-relaxed SiGe layer 3 (the content of Ge: 20 atomic % to the extent in which the stress is sufficiently relaxed) is formed on the SiGe layer 2.

Thereafter, oxygen ions are implanted into the stress-relaxed SiGe layer 3 and then the stress-relaxed SiGe layer 3 is annealed at a high temperature (1350° C.) to form a buried oxide layer 4 in the stress-relaxed SiGe layer 3.

Next, a thin Si layer is epitaxially grown on the stress-relaxed SiGe layer 3 to form a strained Si layer 5. Further, a field effect transistor having the strained Si layer 5 as a channel region is formed on a semiconductor substrate having such a structure to produce a semiconductor device.

In such a semiconductor device, applying a larger strain to the strained Si layer 5 is more effective to increase the mobility of the carriers in the strained Si layer 5. Further, to apply a larger strain to the strained Si layer 5 in the structure of FIG. 1, it is known the content of Ge of the stress-relaxed SiGe layer 3 needs to be increased to enlarge a difference in a lattice constant between the SiGe and Si.

On the other hand, in order to sufficiently produce the effect of the SOI structure, a uniform, continuous, high-quality buried oxide layer 4 is required. This requires a high-temperature annealing process (1350° C.) after the ion implantation of oxygen.

However, SiGe has a property such that an increase in the content of Ge results in a decrease in a melting point. Therefore, when the content of Ge of the stress-relaxed SiGe layer is larger than 20 atomic %, the SiGe layer is melted or oxygen and Ge are vaporized if the SiGe layer is subjected to a high-temperature annealing process. Thus, a uniform, continuous, high-quality buried oxide layer 4 can not be formed.

Also, required is an improvement in a dielectric strength characteristics when a high voltage is applied to a semiconductor device having the above configuration.

SUMMARY OF THE INVENTION

Accordingly, one object of the present invention is to solve the above-noted and other problems.

Another object of the present invention is to provide a high-speed, low-power-consumption semiconductor device.

Another object of the present invention is to provide an improved semiconductor device having high dielectric characteristics.

To achieve these and other objects, the present invention provides a novel semiconductor substrate including a SiGe layer in which the content of Ge is increased so as to apply a large strain to a strained Si layer of the surface thereof and a high-quality buried oxide layer and by reducing the parasitic capacitance of a source and a drain diffusion layer by the use of the semiconductor substrate.

According to the method of the present invention, a buried oxide layer is first formed in the first SiGe layer having a low content of Ge. Since the content of Ge of the first SiGe layer is low, even if the buried oxide layer is annealed at a high temperature, the SiGe layer is not melted and oxygen and Ge do not evaporate. Thus, a uniform, continuous, high quality buried oxide layer is produced. Sequentially, a second SiGe layer having a high content of Ge is grown on the first SiGe layer and a strained Si layer is formed thereon. This introduces a large strain into the crystal lattice of the strained Si layer.

Also, the semiconductor device of the present invention has a second SiGe layer having a higher content of Ge grown on the first SiGe layer and a strained Si layer on the second SiGe layer. Therefore, a large strain is applied to the strained Si layer. Further, the first SiGe layer with a low content of Ge has a larger band gap than the second SiGe layer with a high content of Ge. Accordingly, in a field effect transistor with the source region or the drain region facing the first SiGe layer, the elongation of a depletion layer at the pn junction is large and exhibits high dielectric strength characteristics, even if a high voltage is applied to the gate electrode.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
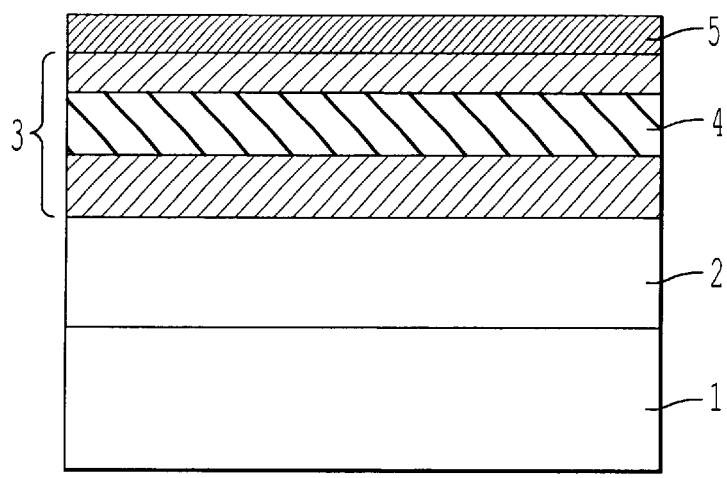
FIG. 1 is a cross-sectional view of a background semiconductor substrate.

Referring now to the drawings, wherein like reference numerals designate identical or corresponding parts throughout the several views, the present invention will be described.

Figure 2:
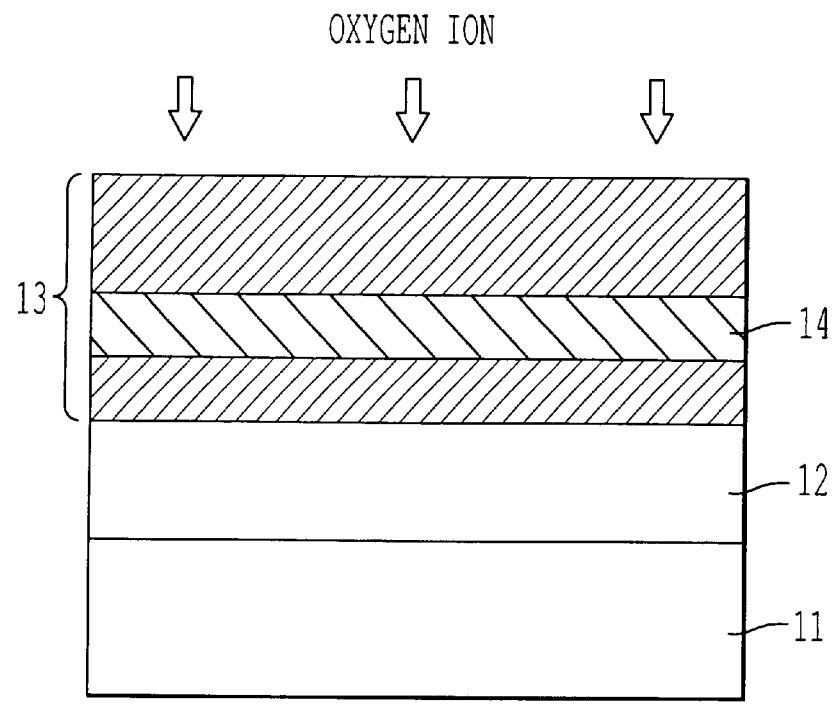
FIG. 2 is a cross-sectional view illustrating the manufacturing process of a semiconductor device in accordance with the present invention.
Figure 3:
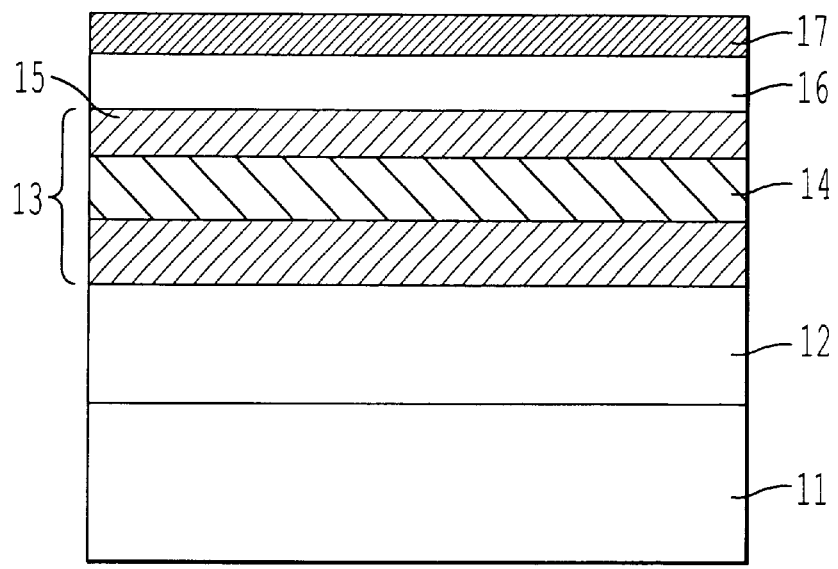
FIG. 3 is another cross-sectional view illustrating the manufacturing process of the semiconductor device in accordance with the present invention.
Figure 4:
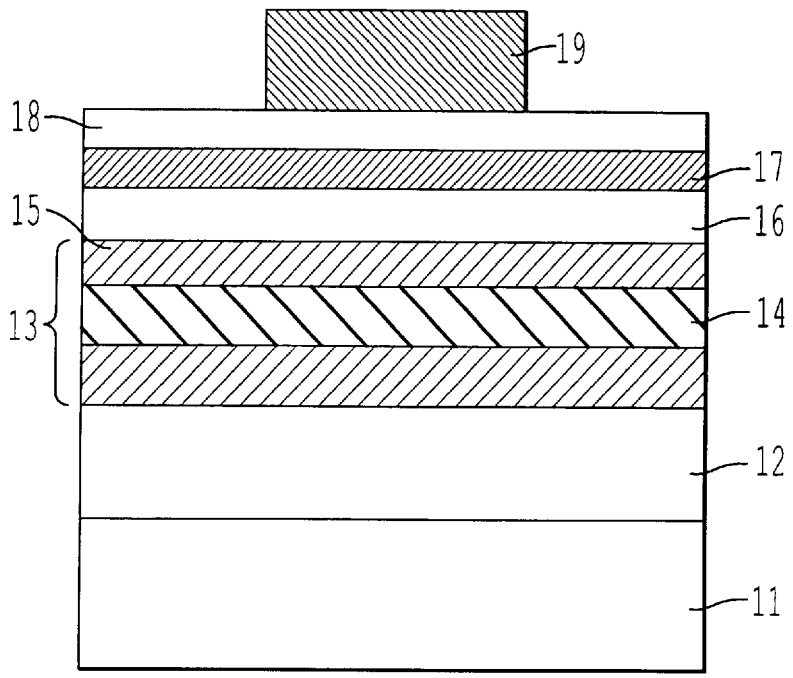
FIG. 4 is yet another cross-sectional view illustrating the manufacturing process of the semiconductor device in accordance with the present invention.
Figure 5:
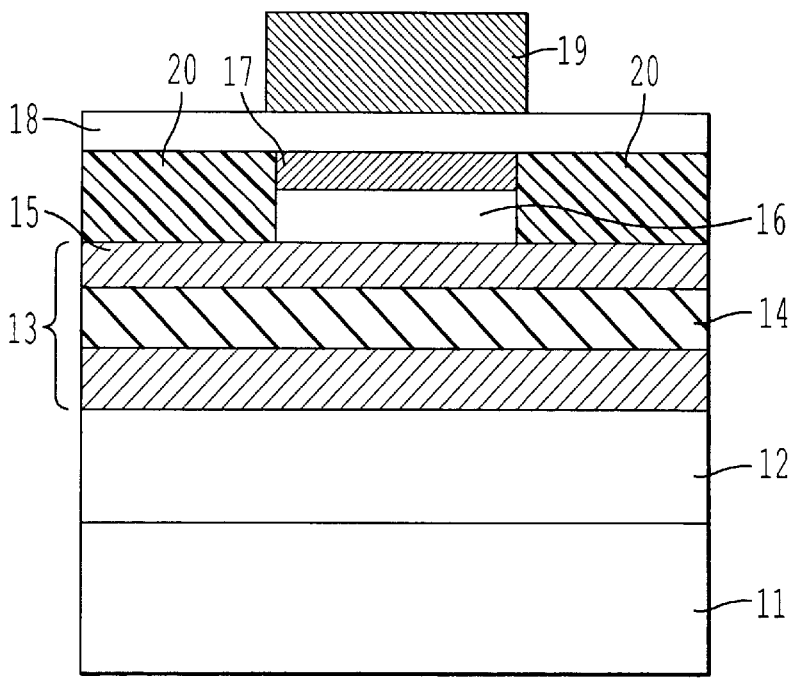
FIG. 5 is a cross-sectional view of a semiconductor device in accordance with the present invention.

In more detail, FIGS. 2–4 are cross-sectional views illustrating the manufacturing process of a semiconductor device, and FIG. 5 is a cross-sectional view illustrating the semiconductor device in accordance with the present invention.

First, a method of manufacturing a semiconductor substrate will be described. As shown in FIG. 2, a graded SiGe layer (third SiGe layer) 12 of 0.8 $\mu$m in thickness is epitaxially gown on a silicon wafer 11. Further, the content of Ge in the third SiGe layer 12 gradually increases from 0 atomic % to 10 atomic %.

Next, a first SiGe layer 13 (in which the content of Ge is fixed at 10 atomic %) is continuously grown on the graded SiGe layer 12. Oxygen ions are then implanted into the first SiGe layer 13 at a dose of $4 \times 10^{17}$ cm$^{-2}$ and at an acceleration energy of 180 keV. The first SiGe layer 13 is then annealed at 1350° C. for 6 hours to form a buried oxide layer 14 of 100 nm in thickness at a depth of 350–450 nm from the surface of the first SiGe layer 13. With this range for the buried oxide layer, oxygen ions can be implanted in high density and with a high accuracy by the above-mentioned method.

Next, as shown in FIG. 3, the first SiGe layer 13 is preferably etched to form a thin layer. In this example, the first SiGe layer 13 is etched 300 nm from the surface thereof to leave a thinner first SiGe layer 15 of 50 nm in thickness on the buried oxide layer 14. When etching the first SiGe layer 13, it is necessary to leave a part of the first SiGe layer. That is, if all the first SiGe layer is etched, a second SiGe layer of high crystallization can not be epitaxially grown in a subsequent process.

Next, a second SiGe layer 16 of 150 nm in thickness is epitaxially gown on the first SiGe layer 15. The content of Ge in the second SiGe layer 16 is about 30 atomic % to form a single crystal layer. A Si layer of a single crystal layer of 20 nm in thickness is then epitaxially grown to form a strained Si layer 17.

In this manner, a semiconductor substrate in accordance with the present invention is obtained. Further, since the second SiGe layer 16 directly under the strained Si layer 17 has a large content of Ge of 30 atomic %, it is possible to apply a sufficient strain to the strained Si layer 17. Also, since the first SiGe layer 13 to form the buried oxide layer 14 has a low content of Ge of 10 atomic % and hence has a high melting point, it can be annealed at a high temperature to form a high quality buried oxide layer.

Then, a field effect transistor is formed on the semiconductor substrate whose surface layer includes the produced strained Si layer 17. For example, as shown in FIG. 4, the semiconductor substrate is thermally oxidized in a dry atmosphere at 800° C. to form a silicon oxide layer of 3 nm in thickness, which is to be a gate insulating layer 18. Next, an n-type polycrystalline Si is deposited in a thickness of 200 nm on the gate oxide layer 18 and is patterned to form a gate electrode 19.

Then, as shown in FIG. 5, As ions are implanted to the interface between the second SiGe layer 16 and the first SiGe layer 15 by using the gate electrode 19 as a mask to form a source region and a drain region 20. The respective interfaces of the source region and the drain region 20 are in the first SiGe layer 13 or at the interface between the first SiGe layer 15 and the second SiGe layer 16. That is, at least one of the source region and the drain region 20 may be in contact with the first SiGe layer 15. Further, the source region or the drain region 20 may be in the first SiGe layer 15 or at the interface between the first SiGe layer 15 and the second SiGe layer 16. The channel region of this field effect transistor is in the strained Si layer 17.

In this manner, a MOS type field effect transistor is completed on the semiconductor substrate in accordance with the present invention.

Further, to produce a uniform, continuous, high-quality oxide layer, an annealing temperature after the oxygen ion implantation is preferably not less than 1280° C. and not more than 1350° C.

Figure 6:
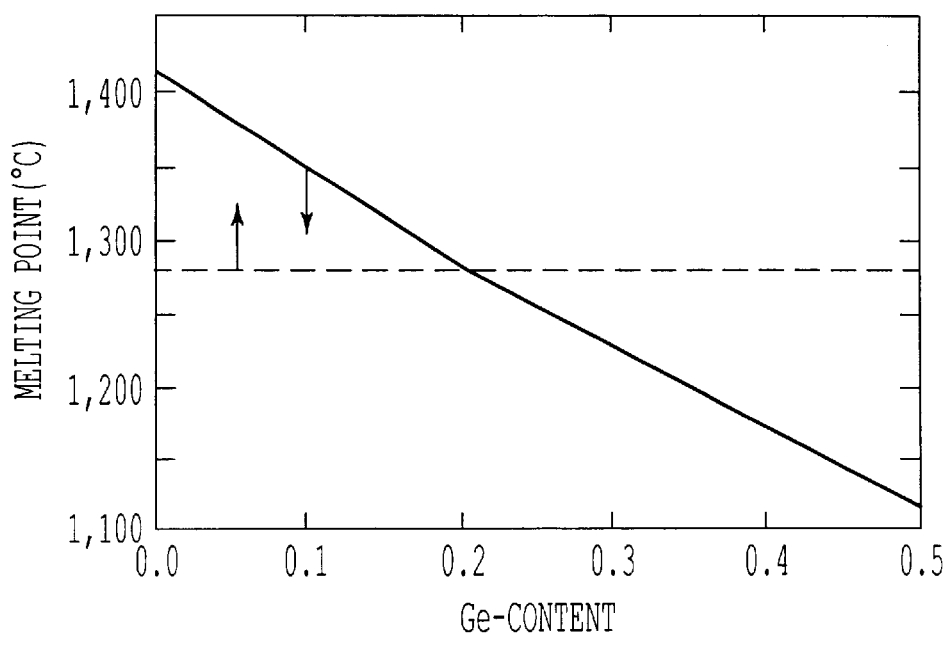
FIG. 6 is a graph showing the relationship between the content of Ge of SiGe and a melting point.

Turning now to FIG. 6, which is a graph showing the relationship between the content of Ge and the melting point of SiGe. As shown in FIG. 6, in order to set the melting point (solid line) of the first SiGe layer 13 at a temperature not less than a minimum annealing temperature of 1280° C. where the buried oxide layer 14 can be formed, the content of Ge of the first SiGe layer 13 is at least not higher than 20 atomic %. Also, from the viewpoint of making a lattice match between the first SiGe layer and the second SiGe layer, the content of Ge of the first SiGe layer is not lower than 1 atomic %.

In addition, it is more preferable the content of Ge of the first SiGe layer is not lower than 5 atomic % and not higher than 15 atomic %. On the other hand, if the content of Ge of the second SiGe layer 16 is at least larger than that of the first SiGe layer, then it is possible to apply a larger strain to the strained Si layer 17. Also, to match the strains between the respective layers to each other, the content of Ge of the second SiGe layer 16 is preferably not higher than 90 atomic %.

Further, it is more preferable the content of Ge of the second SiGe layer 16 is not lower than 15 atomic % and not higher than 90 atomic %, and still more preferably, it is not lower than 20 atomic % and not higher than 80 atomic %.

Also, to make a lattice match between the first SiGe layer and the second SiGe layer 16 and to apply a larger strain to the strained Si layer 17, the content of Ge of the second SiGe layer 16 may be graded in the direction of a layer thickness in a range higher than the content of Ge of the first SiGe layer, for example, from 15 atomic % to 90 atomic %. At this time, the content of Ge of the second SiGe layer 16 is made larger at the side of the strained Si layer 17.

Further, the layer thickness of the first SiGe layer 15 on the buried oxide layer 14 is preferably not less than 1 nm and not more than 400 nm so as to relax a lattice. Also, the layer thickness of the second SiGe layer 16 is preferably not less than 1 nm and not more than 400 nm so as to relax a lattice.

In addition, to introduce a large strain into the strained Si layer 17, the layer thickness of the second SiGe layer 16 may be larger than that of the first SiGe layer 15. Further, a ratio of the layer thickness of the first SiGe layer 15 on the buried oxide layer to that of the second SiGe layer 16 (the layer thickness of the first SiGe layer 15 on the buried oxide layer the layer thickness of the second SiGe layer 16) is preferably not less than 1.

In addition, the stress applied to the strained Sit layer 17 of the semiconductor substrate in accordance with the present invention is determined by calculation. First, for the sake of simplicity, the stress of the strained Si layer 17 and that of the buried oxide layer 14 will be neglected. The stress applied to the strained Si layer 17 is determined from the stress balance between the first SiGe layer 15 and the second SiGe layer 16. Assuming the thickness of the first SiGe layer 15 and the thickness of the second SiGe layer 16 are T2 and T3, respectively, the lattice constants of the first and second SiGe layers 15, 16 (when the lattices are completely relaxed) are a2 and a3, and a lattice constant on a x-y plane when the stresses are balanced is "a", the balance between the compressive force of the second SiGe layer 16 and the tension of the first SiGe layer 15 is expressed as follows:

$$(a3-a)T3=(a-a2)T2.$$

From this equation, the lattice constant "a" is given by:

$$a=(a3T3+a2T2)/(T2+T3) \quad (1).$$

Also, assuming the lattice constant of the SiGe is proportional to the content X of Ge, $$a(x)=(a_{Ge}-a_{Si})x+a_{Si},$$

where $a_{Ge}$ and $a_{Si}$ are the ordinary lattice constants of Ge and Si.
Therefore, the above equation (1) can be expressed as follows:

$$a=((a_{Ge}-a_{Si})(x3T3+x2T2)+(T2+T3)a_{Si})/(T2+T3) \quad (2).$$

In addition, if T2=T3, $$a=(a_{Ge}-a_{Si})(x2+x3)/2+a_{Si} \quad (3).$$

Therefore, the stress which makes the lattice constant of the x-y plane of the strained Si layer 17 equal to the mean value of the content of Ge of the first SiGe layer 15 and that of the second SiGe layer 16 is applied to the strained Si layer 17 of the semiconductor substrate.

Therefore, since x3>x2, the two SiGe layers, which are different in content of Ge from each other, can always introduce a larger strain into the strained Si layer than the first SiGe single layer. For example, the strain when x=0.2 can be effectively introduced into Si.

As described above, in accordance with the present invention's method of manufacturing a semiconductor device, a field effect transistor can be formed on a semiconductor substrate having a high-quality buried oxide layer and a large strained Si layer and a high-speed, low-power-consumption semiconductor device can be realized. Further, since the semiconductor device has a field effect transistor formed on a semiconductor substrate having a large strained Si layer, it can realize a high speed operation and low power consumption. Still further, the first SiGe layer 15 having the low content of Ge has a larger band gap than the second SiGe layer 16 having the high content of Ge. Therefore, when the interface of a pn junction at the interface of the source region or the drain region faces the first SiGe layer 15, the dielectric strength characteristics of the pn junction is high.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:

forming a first SiGe layer on a substrate;

forming an oxide layer by implanting oxygen ions into the first SiGe layer and annealing the substrate;

forming, on the first SiGe layer, a second SiGe layer which has a higher content of Ge than the first SiGe layer;

forming a strained Si layer on the second SiGe layer; and forming a field effect transistor in which the strained Si layer is used as a channel region of the field effect transistor, wherein a content of Ge in the first SiGe layer is not lower than 1 atomic % and not higher than 20 atomic %, and wherein the content of Ge in the second SiGe layer is higher than a content of Ge in the first SiGe layer and is not higher than 90 atomic %.

2. The method according to claim 1, further comprising:

removing a part of the surface of the first SiGe layer after the oxide layer is formed.

3. The method according to claim 1, wherein an annealing temperature in the step of forming the oxide layer is not less than 1280° C. and not more than 1350° C.

4. The method according to claim 1, wherein a layer thickness of the first SiGe layer on the oxide layer is the same as or thicker than a layer thickness of the second SiGe layer.

5. The method according to claim 4, wherein the layer thickness of the first SiGe layer on the oxide layer is not less than 1 nm and not more than 400 nm, and wherein the layer thickness of the second SiGe layer is not less than 1 nm and not more than 400 nm.

6. The method according to claim 1, wherein the second SiGe layer and the strained Si layer are epitaxially grown.

7. The method according to claim 1, wherein the substrate comprises a silicon layer and a third SiGe layer formed on the silicon layer, and wherein a content of Ge in the third SiGe layer is graded in a direction of thickness of the third SiGe layer.

8. The method according to claim 1, wherein the content of Ge in the second SiGe layer is graded in a direction of thickness of the second SiGe layer.

9. The method according to claim 1, wherein at least one of source and drain regions separately formed in the strained Si layer reach the first SiGe layer.

* * * * *